US006240635B1

(12) United States Patent
Graves et al.

(10) Patent No.: US 6,240,635 B1
(45) Date of Patent: Jun. 5, 2001

(54) PRINTED CIRCUIT BOARD SCRAP REMOVAL AND PRINTED CIRCUIT BOARD FABRICATION PROCESS

(75) Inventors: Scott Peter Graves, Zumbro Falls; George Anton Huston, Rochester, both of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/196,885

(22) Filed: Nov. 20, 1998

(51) Int. Cl.[7] ............................................. H05K 3/34
(52) U.S. Cl. ........................ 29/840; 29/412; 29/413; 29/414; 29/415
(58) Field of Search ............................ 29/840, 846, 412, 29/413, 414, 415; 361/412, 415; 174/250, 254, 255

(56) References Cited

U.S. PATENT DOCUMENTS

| | | | | |
|---|---|---|---|---|
| 4,684,916 | * | 8/1987 | Ozawa | 338/308 |
| 5,116,641 | * | 5/1992 | Patel et al. | 427/96 |
| 5,157,829 | * | 10/1992 | Schmidt et al. | 29/846 |
| 5,773,764 | * | 6/1998 | von Vajna | 174/250 |

* cited by examiner

Primary Examiner—Gregory L. Huson
Assistant Examiner—Sean Smith
(74) Attorney, Agent, or Firm—Laurence R. Letson

(57) ABSTRACT

Circuit boards are formed within the boundaries of an insulative sheet or panel such that the panel may be automatably processed. The periphery of each printed circuit board is defined by at least a plurality of score lines which do not extend to the edge of the sheets and may include also uncut and/or unscored areas to provide stability to either the sheet or segments of scrap material, lending rigidity to the sheet. Following complete fabrication of the printed circuit board, the sheet is cut by a routing process to extend selected score lines to the edges of the sheet to destroy the integrity of the frame of scrap material surrounding the printed circuit boards.

19 Claims, 5 Drawing Sheets

US 6,240,635 B1

PRINTED CIRCUIT BOARD SCRAP REMOVAL AND PRINTED CIRCUIT BOARD FABRICATION PROCESS

FIELD OF THE INVENTION

This invention relates to the field of printed circuit board panel manufacture and processing and more specifically to the excess panel material, surrounding the printed circuit board which remains at completion of processing, that is considered to be scrap and must be removed.

BACKGROUND OF THE INVENTION

Printed circuit boards are commonly manufactured in various shapes and sizes dependent upon the environment and the apparatus for which they are intended. Such diversity of shape and size is difficult to handle and process in the commonly used automated equipment to screen print solder, to populate the printed circuit boards, and to solder the electronic components to the printed circuit board.

The automated equipment so economically advantageous and useful for high volume processing of printed circuit boards requires items to be uniformly sized and shaped for their transport through the machinery. Accordingly, to accommodate this uniform size and shape necessity, panels of printed circuit board substrates thus are sized larger than the printed circuit boards themselves and leave, for handling purposes, a "frame" of scrap or excess material surrounding the printed circuit board. Multiple circuit boards, typically identical boards, may be accommodated in varying shapes and quantities within each panel. These panels ultimately require trimming around the printed circuit board to eliminate the waste or scrap frame surrounding them.

As a final finishing step, scrap or frame material surrounding the printed circuit board has been removed from the printed circuit board by usually one of two processes. One method uses a router to rout and remove material surrounding the edges of the printed circuit board. A router is a device which may be very simple or may be highly mechanized and automated whereby a motor drives a rotary bit, the rotary bit cutting the printed circuit board substrate material at the edge of the printed circuit board, easily severing the printed circuit board from the frame of scrap material between the printed circuit board and the edge of the panels. Routers of this type may be numerically or computer controlled and typically are used in facilities manufacturing a large number of circuit boards. Routing has been the process dictated whenever the card shapes are other than "pure" rectangles, i.e., having protruding tabs for contact pads.

To rout a panel of printed circuit boards can consume several minutes. Reduce the routing time and a significantly higher number of panels can be processed by the router in the same period frame, significantly reducing the cost of the scrap separation step. The time consumed in the routing operation makes it an expensive step in printed circuit board production and a primary target for cost reduction.

A second process of excess or scrap material removal scores the panels of the printed circuit boards in such a way as to define the exterior boundaries of the printed circuit boards; this scoring weakens the scrap frame around the printed circuit boards to the point where they may be easily broken or snapped in a manual scrap removal operation. Scoring of the panel results in score lines being formed in one or preferably both faces of the printed circuit board panel. The scoring of the opposite faces of the panel is accomplished by a machine which has two opposing rotary blades which cut into the surface of the printed circuit board panel. Rotating blades close from opposite directions onto the printed circuit board; and, as the printed circuit board is translated relative to the blades, a groove is cut into each of the opposing surfaces of the printed circuit board panel, leaving a thin web of material between the two opposing grooves or score lines.

The remaining web of material extends between the printed circuit board and the scrap material surrounding it. Score lines typically extend in such a manner that they intersect at the corners of the printed circuit boards as well as extend across the frames of the scrap material. The score lines severely weaken the panel, as intended, but also affect the rigidity of the panels to the point that the panels may not be reliably handled by the automated processing equipment used on the panels, i.e., solder screening, populating of a board with electronic circuit board elements and the soldering of the elements to a circuit board.

Any panel which breaks or separates from the printed circuit board during the processing disqualifies the printed circuit board from further automated processing inasmuch as it is no longer the standardized, uniform panel required by the equipment. Frequently, the printed circuit board becomes scrap once it cannot be efficiently handled by the automated processing equipment. The separated printed circuit boards could be reworked manually; however, the cost of reworking a circuit board is prohibitive under current manufacturing techniques. Commonly, it is more economical to scrap a circuit board, even one almost completely finished, rather than to attempt to manually rework it.

OBJECTS OF THE INVENTIONS

It is an object of the invention to improve printed circuit board panel rigidity and integrity, to enhance processing the printed circuit board panel in automated equipment, and to minimize processing time, removing the printed circuit boards from the excess material frame of the panel.

It is another object of the invention to reduce routing operations necessary to remove scrap while maintaining adequate panel rigidity necessary to permit automated processing of the printed circuit board panel.

SUMMARY OF THE INVENTION

A panel or sheet of insulative material, such as fiberglass or other suitable non-conductive plastic, is plated or otherwise coated with a thin layer of copper or other conductive material. The conductive layer is etched into a pattern to form a electrical circuit pattern on the surface of the fiberglass sheet. This pattern may be repeated in a plurality of locations assuming the size of the pattern and the size of the panel permit.

A border or margin around the electrical circuit pattern forms a frame of excess material useful only in automatic handling. Adjacent circuit patterns may be displaced from each other to permit an unused segment of scrap material to remain between the adjacent circuit patterns. Alternatively, the adjacent circuit patterns may be placed such that no unused material shall remain between the two patterns once the printed circuit boards are completed.

The shape of a printed circuit board is considered to be complex if it is other than a rectangle, such as having a projecting tab. Score lines cannot be cut to end precisely; therefore, a routing operation is conducted to cut the complex shapes.

The printed circuit board panel then may be scored by one or more saw blades, partially cutting into opposing faces or surfaces of the circuit board yet leaving a thin web or membrane of uncut insulative material. The web will be brittle by virtue of the characteristics of its material and can be broken later. Typically, score lines will outline the boundaries of the printed circuit board and, if circumstances permit, may extend slightly beyond the corners of the printed circuit board boundary to ensure that orthogonal score lines intersect. Where a routing operation has defined a complex shape, score lines may intersect or join the router cuts. Solder paste may be screened onto the contact points that the circuit components will make contact and be soldered. The automatic populating machines place the components onto the solder paste deposits, and the solder paste is reflowed to solder the components to the circuit pattern.

Panels are subjected to router cuts which extend some of the score lines to the edges, saving processing time and cost. By destroying the rigidity and integrity of the frame, individual sections of scrap may be broken off and discarded without subjecting the printed circuit boards to flexing or bending.

Once completely processed by the automatic processing equipment, the printed circuit board is separated from the scrap material and, in order to reduce the size of the printed circuit board to the design parameters, the scrap discarded. Score lines, while generally extended beyond the printed circuit board boundaries, do not weaken the frame sufficiently to cause undesired breakage; however, if subsequently router cut to the panel edge, these score lines permit breaking of the scrap material forming the frame without the flexing the printed circuit boards.

Flexing the printed circuit boards may cause breakage of the printed circuit lines or cause separation of the printed circuit board and associated surface mounted circuit elements that are soldered onto the printed circuit board, thereby damaging the printed circuit board.

By combining the scoring technique with limited routing or cutting, the time required to remove the scrap from the printed circuit board is greatly reduced. The routing occurs in very localized areas wherever the weakened portion of the panel, the score line, is extended to the edge of the panel or wherever a complex shaped printed circuit board has a portion which is attached for stability to the frame by an unscored or unrouted bridge.

By reducing the required routing operation, the routing time may be very significantly reduced, by a factor of 80 to 90 percent, over that required for a complete routing operation separation.

A more complete understanding of the invention may be had by reference to the attached drawings and the Detailed Description of the Invention to follow.

DETAILED DESCRIPTION OF THE INVENTION

Figure 1:
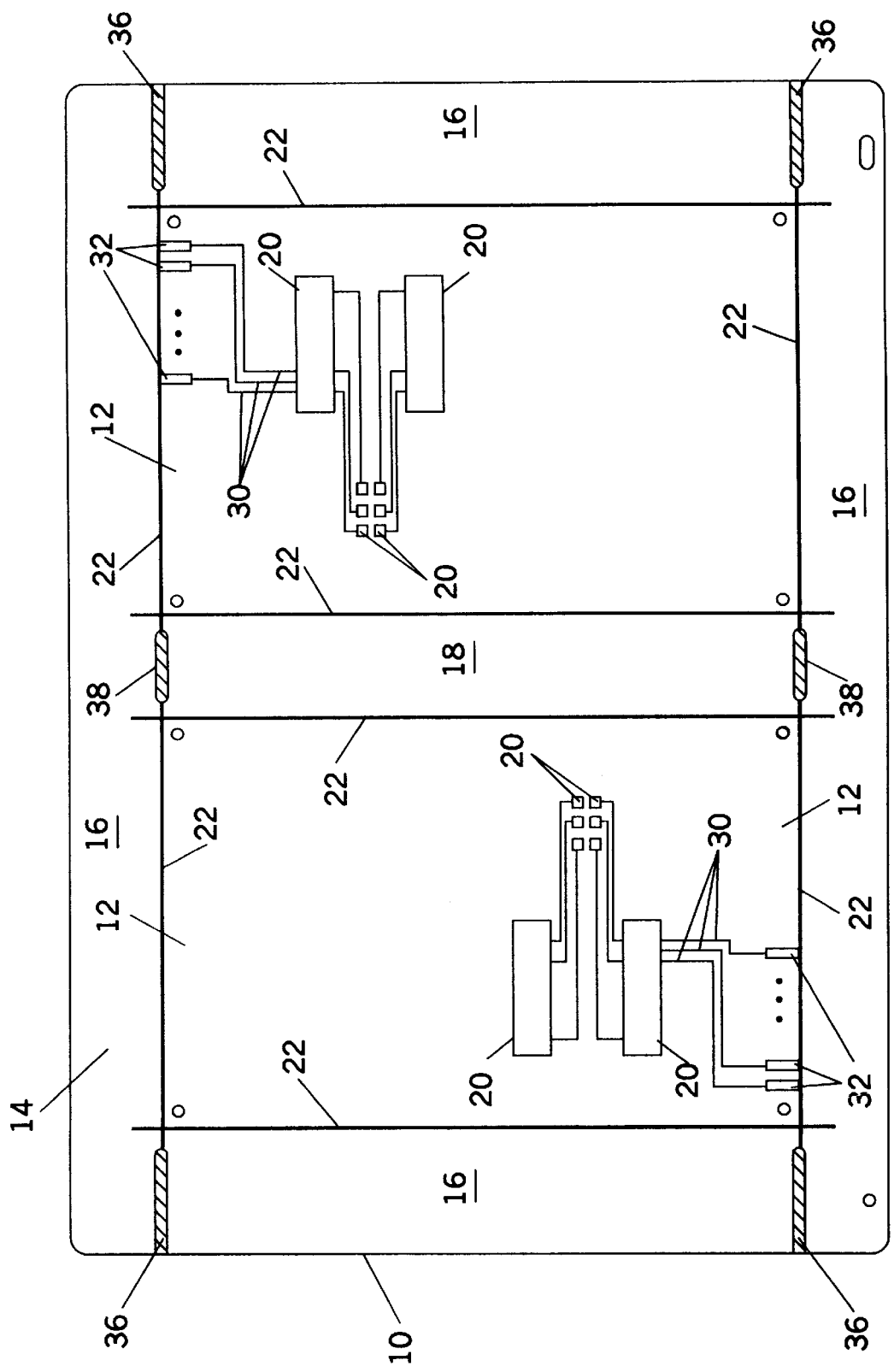
FIG. 1 illustrates a printed circuit board panel with two printed circuit boards and a strip of the frame separating the two printed circuit boards.

Referring initially to FIG. 1, a sheet or panel 10 of fiberglass material or other suitably insulative plastic sheet material is illustrated in a standard form and dimension. The outside dimension of the panels 10 may differ; however, any particular circuit board is configured and processed on panels 10 that are uniform in dimension. The maximum dimensions of any particular panel 10 will depend on the maximum panel dimensions that can be accepted by the automatic processing machinery used for component placement or solder screening and reflow soldering.

The dimensions of a particular circuit board 12 are determined by the requirements of the device in which the circuit board 12 is intended to be installed. Automated machinery may be set up to process a particular sized panel 10. Accordingly, for high quantity production runs, panel 10, having an adequate area for one, two or more printed circuit boards 12, may be sized and the equipment set up to process that particular sized panel 10. Should it be desired to run panels 10 which require different outside dimensions, the processing machinery will have to be re-configured. Frame 14 may have not only margins 16 surrounding the printed circuit boards 12 but also may have an intermediate region 18 disposed between the multiple printed circuit boards 12.

Score lines 22 define the periphery or boundaries of a particular printed circuit board 12, disposed such that they circumscribe the printed circuit board 12. In FIG. 1, the score lines 22 are cut by a scoring machine such that the orthogonal score lines 22 intersect at the corners of the printed circuit board 12 and extend a short distance into the margins 16 of the panel 10. The essential consideration in this embodiment is that the score lines 22, although intersecting, do not extend so far into the margins 16 around printed circuit boards 12 that the frame 16 is weakened to the point that panel 10 is unstable. It is desirable to extend the score lines 22 into the margins 16 far enough to be engaged by a router cut without damaging the printed circuit board 12.

Score lines 22 may be cut into only one face of the panel 10 or, alternatively, may be cut into the opposing faces. The cutting of the score lines 22 may be accomplished, for example, by a device having a rotary blade similar to a saw blade, engaged with panel 10 and cutting into panel 10 only a small fraction of the total thickness of panel 10. In the event that the score line 22 is cut only on one side or into one face of panel 10, the depth of the cut may be substantially increased so long as it leaves a quantity or thickness of material sufficient to hold and transport the printed circuit board 12 whenever panel 10 is handled by frame 14.

If the score lines 22 are cut into the faces on both sides of panel 10, then any remaining web or membrane of the material from which panel 10 is fabricated will reside generally at the center line of the thickness of panel 10, and the cuts on each of the opposing faces of panel 10 necessarily must be shallower.

The printed circuit boards 12 in FIG. 1 each have contact pads 32 on one surface of the printed circuit board 12 and disposed at the edge of the printed circuit board 12. The contact pad 32, as well as the conductors 30, typically are formed by coating or plating one surface of the circuit board 12 with a thin layer of conductive metal, typically, copper or copper alloy. After the metal layer has been deposited on the surface of panel 10, a selective removal process such as etching defines the pattern of the conductors 30. The pattern of conductors 30 can be defined by the application of a photo-resist or other masking material which then may be light activated to cause a selective hardening of the resist layer and to flush away the unexposed patterns, thus exposing the copper layer or other electrically conductive layer to the acid for etching and removal or separation. Other selective removal or deposition processes may be used to form the conductors 30 and contact pads 32 of the electrical circuit on each printed circuit board 12.

After the fabrication of the circuit pattern, panel 10 undergoes a solder screening process to deposit solder paste at contact points and further processed by a component placement apparatus, where the components of an electronic circuit are placed in appropriate locations on the conductors and solder paste deposits.

Thereafter, the entire panel 10, including frame 14 and printed circuit boards 12 carrying the electrical components 20, will be sent through a solder reflow operation so that solder connections between the electrical components 20 and the conductors 30 are flowed or reflowed to form permanent electrical connections between the printed circuit board 12 and the electrical components 20.

Score lines 22, running the longitudinal direction of panel 10 in FIG. 1, are interrupted in segment region 18 between printed circuit boards 12. By leaving unscored material or bridges in segment region 18, the rigidity of frame 14 is improved.

Separation of frame 14 from printed circuit boards 12 is a combination of two processes, routing and scoring/breaking. The first process performed is the routing of the material between the ends of printed circuit board defining score lines 22 in one direction, preferably in the direction which will require the fewest number of routing operations. Routing cuts 36 are illustrated in FIG. 1 as extending the longitudinal score lines 22 to the edges of panel 10. Additional routing cuts 38 are made to remove an unscored bridge of material left between the adjacent overrun ends of score lines 22 in the segment 18 of frame 14.

Routing may be accomplished by a computer controlled or numerically controlled router which will make a cut from the edge of the panel 10 extended inwardly by a distance sufficient to meet with and engage the ends of score lines 22 extending longitudinally on panel 10.

At this point in the process, routing operations are complete for panel 10 and scrap frame segments 16, 18 may be manually separated from printed circuit board 12. Separation of frame 14 is accomplished by manually flexing along the longitudinal score lines 22 and router cuts 36, 38 thus breaking longitudinal segments of frame 14 from the ends of printed circuit boards 12. Once both of the pieces of scrap forming the longitudinal segments of frame 14 have been separated, then the transverse segments 16 of frame 14 may be separated by bending or flexing frame segments 16 relative to printed circuit board 12. Similarly, section 18 may be separated in the same manner. Caution must be taken to not flex the circuit boards 12 as scrap sections are separated from the periphery of printed circuit board 12. Flexing the circuit boards 12 may break conductors 30 or cause separation between the rigid components 20 and the more flexible printed circuit board 12.

Figure 2:
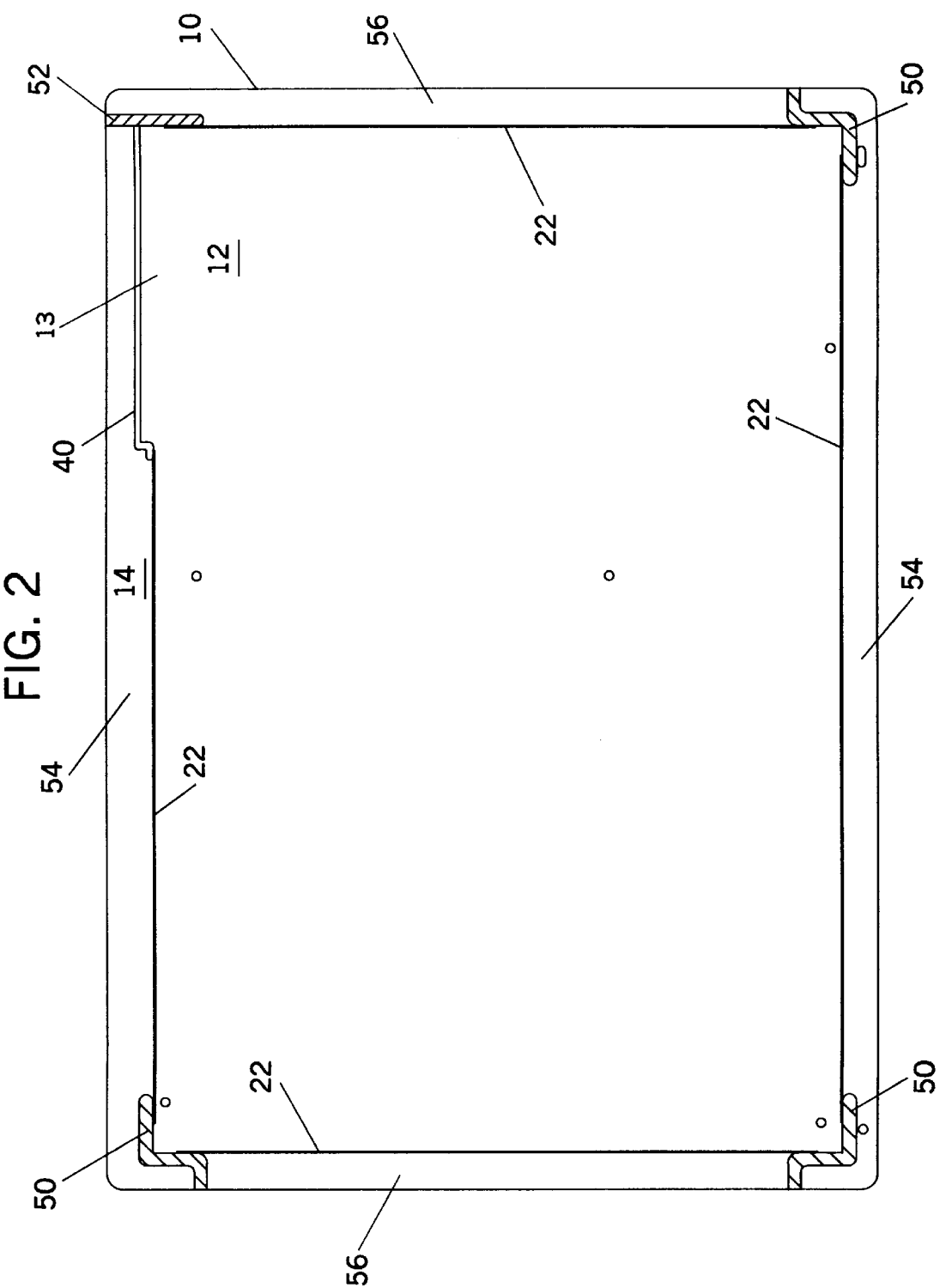
FIG. 2 illustrates a single printed circuit board on a panel whereby the printed circuit board is so large that routing must occur at each corner to adequately weaken the frame if score lines do not overrun the boundaries with the printed circuit board.

With respect to FIG. 2, a printed circuit board 12 is illustrated with a routed pre-cut 40, having been made around the periphery of the tab 13 of printed circuit board 12 extending into the frame 14. Due to the size of printed circuit board 12 relative to panel 10 in this embodiment, there is insufficient material in frame 14 to permit the score line 22 to overrun the corners of printed circuit board 12 and still maintain rigidity and integrity of panel 10. Accordingly, score lines 22 only approach the corners of printed circuit board 12, thus leaving unscored bridging material at the corners to support frame 14 and printed circuit board 12.

Understanding the desire to leave unscored material at the end of the score lines 22, it is necessary to subsequently rout that material and remove that unscored material on both of the adjoining edges of the printed circuit board 12, forming the corners of printed circuit board 12. A routing cut, in a generally jogged or "Z" path 50, is made at three of the four corners of printed circuit board 12. Because routing pre-cut 40 has been made previously and extends to the corner of printed circuit board 12, it is only necessary to make a straight cut 52 with the router on the fourth corner to connect the transverse score line 22, the router pre-cut 40 and the edge of panel 10. Thereafter, the side segments of frame 14 designated as 54 can be broken away along score lines 22. End segments 56 of panel 10 and particularly frame 14 then may be removed by flexing along their respective score lines 22.

Figure 3:
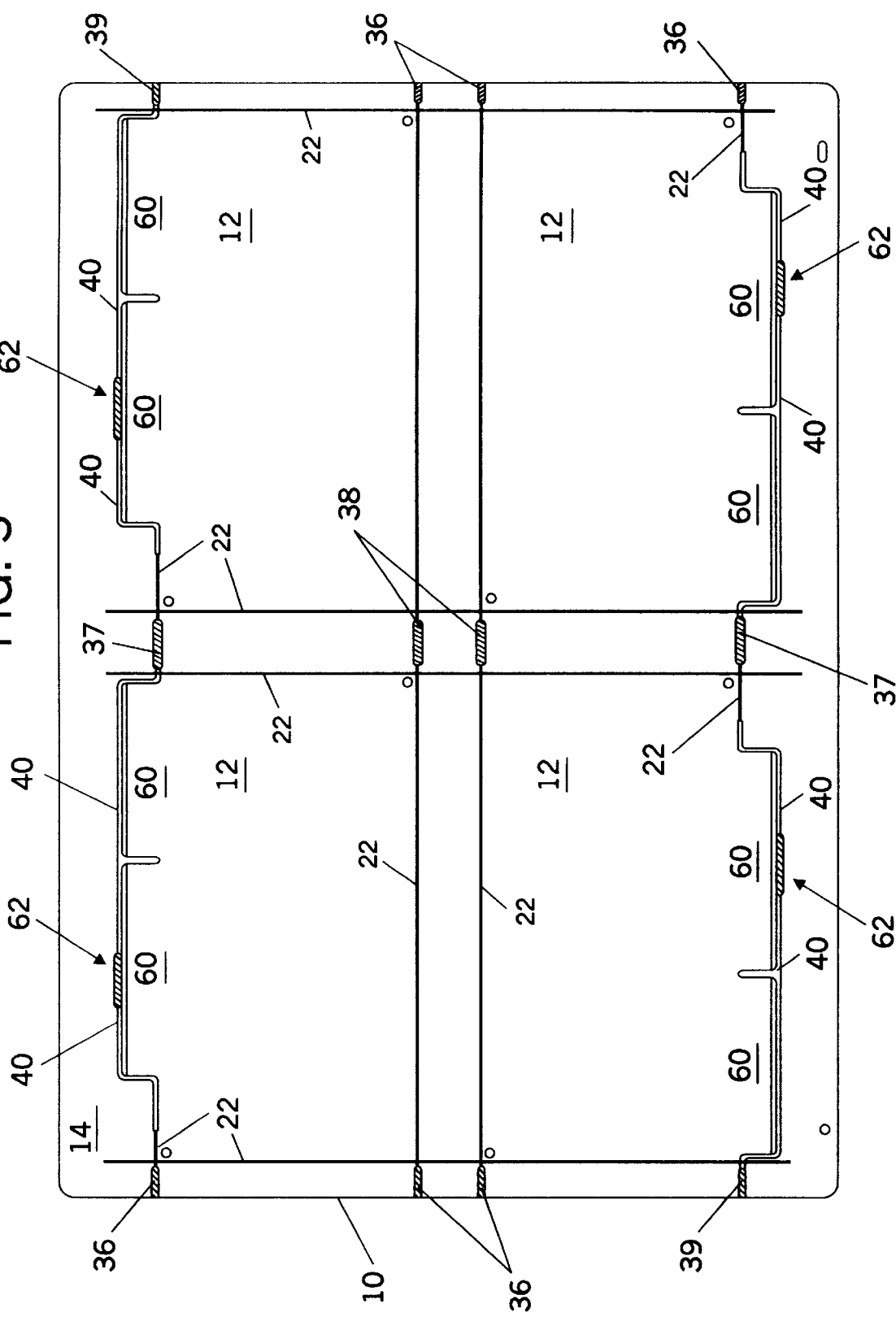
FIG. 3 illustrates a printed circuit board panel having four printed circuit boards thereon with portions of the frame residing between the printed circuit boards and routing paths designated at portions of the periphery of the printed circuit boards.
Figure 4:
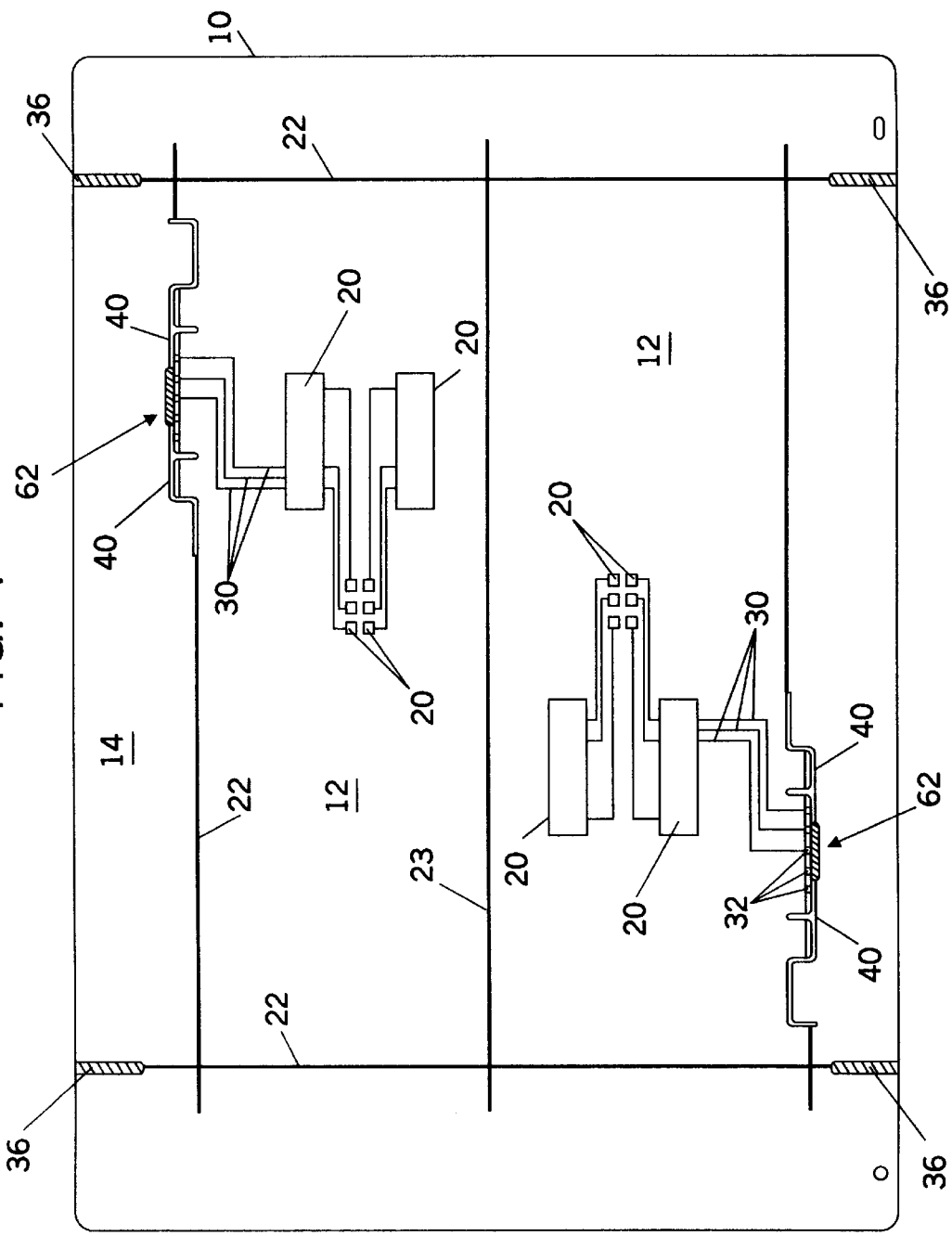
FIG. 4 illustrates a printed circuit board panel with two printed circuit boards thereon with one edge of each of the two printed circuit boards common and a tab attached to the frame by a bridge, the tab shape defined by an interrupted routed path.
Figure 5:
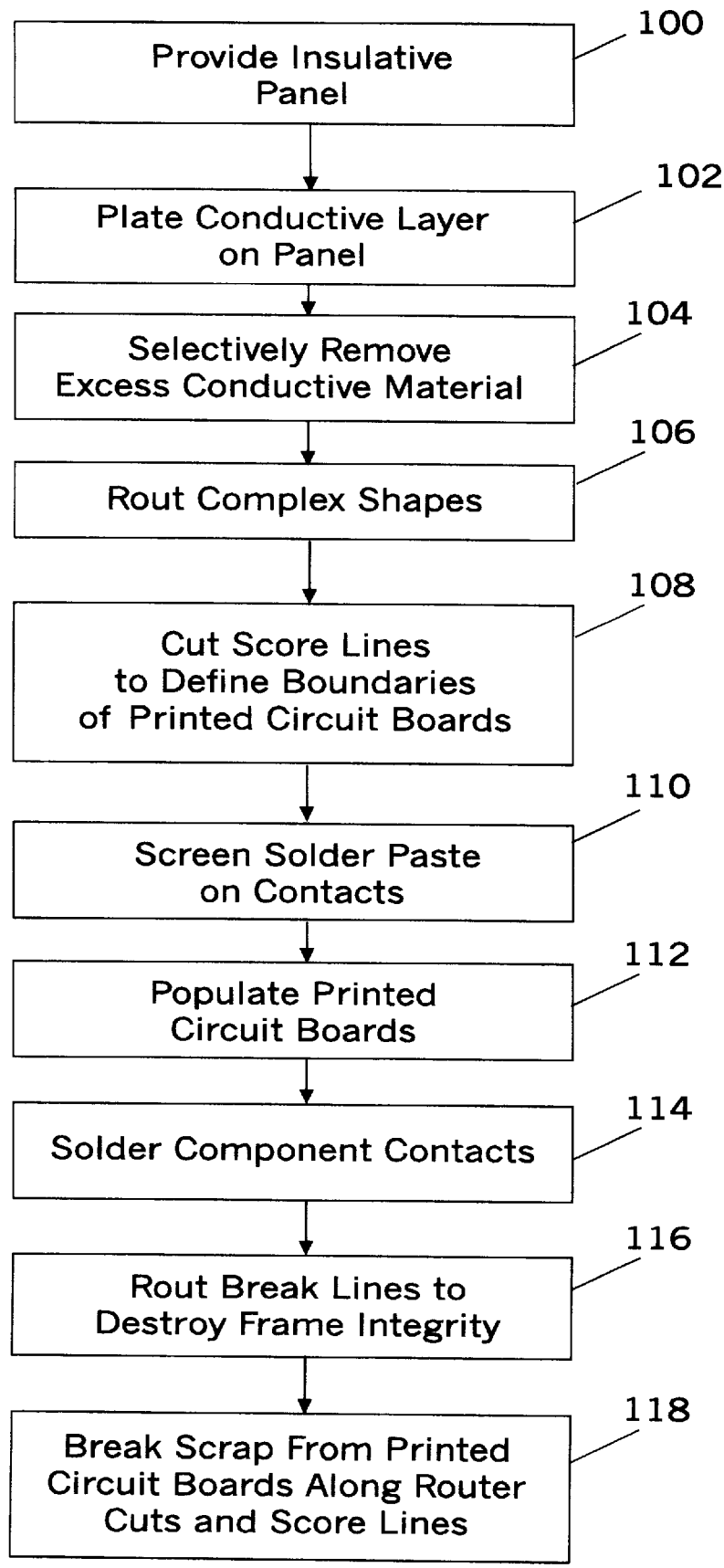
FIG. 5 is a flow diagram of a printed circuit board process of manufacture.

Circuit elements and conductors together with the contact pads illustrated in FIGS. 1 and 4 are only exemplary and may be formed in any desirable pattern to accomplish the requirements of the circuit board designer. While similar circuit patterns have not been illustrated in FIGS. 2 and 3, one should understand that one of skill in the art may incorporate any such desired circuits into the printed circuit boards 12 in FIGS. 2 and 3 by one of skill in the art.

Referring now to FIG. 3, panel 10 incorporates printed circuit boards 12 in what is known as a "four up pattern." In this instance, a router pre-cut 40 has been made to form the complex shape of the tabs 60 on each of printed circuit boards 12. Because the router pre-cut 40 substantially weakens the integrity of panel 10 and jeopardizes the reliable processing of printed circuit board 12, a region of unscored and unrouted material is preserved as a bridge between at least one of the tabs 60 with frame 14 and is later removed with router cuts 62.

Router cuts 36 extend between the end of score line 22 and the edge of panel 10; router cuts 39 extend the router pre-cut 40 to the edge of panel 10; router cuts 37 interconnect score line 22 and router pre-cut 40 on adjacent printed circuit boards 12; and router cuts 38 remove the bridge of material left by the interrupted score lines 22.

While individual electronic components, conductors and contact pads are not illustrated in FIG. 3 for simplicity of illustration, conductors, contact pads and components may be positioned thereon and soldered, as discussed earlier. Scrap segments of frame 14 may be separated by bending and breaking without undue flexing of printed circuit boards 12.

Referring now to FIG. 4, two printed circuit boards 12 are laid out on a panel 10 with router pre-cuts 40 partially defining the complex shape on printed circuit boards 12. Router pre-cuts 40 leave an unscored, uncut region subsequently removed by router cuts 62 to stabilize the frame 14 and the complex peripheral shape of printed circuit board 12. To remove the scrap of frame 14 from printed circuit board 12, a routing operation makes cuts 36 to extend score lines 22 to the edge of panel 10; additional cuts 62 are made to remove the material which remained after the routing pre-cuts 40 were made. Once the routing cuts 36, 62 have been made, the scrap material forming frame 14 may be flexed about score lines 22 and then the remainder of frame 14 separated from printed circuit boards 12. In this instance, printed circuit boards 12 have a common score line 23 intermediate printed circuit boards 12. The two printed circuit boards 12 may be separated by merely bending and breaking the circuit boards 12 apart at score line 23.

What is claimed is:

1. A method of forming a printed circuit board comprising the steps of:

providing an insulative sheet of material;

forming on at least one surface of said insulative sheet a plurality of conductive patterns, defining circuit conductive paths;

scoring said sheet to form an outline of said printed circuit board with score lines while preserving a frame of insulative sheet material at least partially surrounding said printed circuit board, said scoring terminated short on an edge of said printed circuit board;

removing all material of said printed circuit board remaining unscored after said scoring step between at least one of said score lines and an edge of said sheet, and breaking said sheet at said score line, thereby separating segments of said frame from said printed circuit board.

2. The method of claim 1 wherein said step of removing extends between ends of said score line and said edge of said sheet and is performed at and produces cuts connecting to opposite edges of said sheet.

3. The method of claim 1 wherein said removing step is performed between at least one of said score lines and an edge of said sheet intersecting with said edge of said sheet, thereby destroying said frame integrity.

4. The method of claim I comprising the further steps of:

depositing solder on selected regions of said conductive pattern;

populating said printed circuit board with electrical circuit elements;

reflowing said solder, thereby electrically connecting said conductive pattern to said electrical circuit elements.

5. The method of claim 2 comprising the further steps of:

depositing solder on selected regions of said conductive pattern;

populating said printed circuit board with electrical circuit elements;

reflowing said solder, thereby electrically connecting said conductive pattern to said electrical circuit elements.

6. The method of claim 3 comprising the further steps of:

depositing solder on selected regions of said conductive pattern;

populating said printed circuit board with electrical circuit elements;

reflowing said solder, thereby electrically connecting said conductive pattern to said electrical circuit elements.

7. A method of forming a printed circuit board comprising the steps of:

providing an insulative sheet of material;

forming on at least one surface of said insulative sheet a plurality of conductive patterns, forming circuit conductive paths;

cutting said sheet to partially define a periphery of said printed circuit board;

scoring said sheet to form a partial outline of said printed circuit board with score lines, while preserving a frame of insulative sheet material at least partially surrounding said printed circuit board, said scoring terminated short of an edge of said printed circuit board;

further removing all material of said frame remaining unscored after said scoring step from ends of at least a plurality of but less than all of said score lines through said frame, destroying any integrity of said frame, and breaking segments of said frame from said printed circuit board along said score lines.

8. The method of claim 7 wherein step of further removing occurs between ends of at least one of said score lines and intersecting with edges of said sheet and is performed at and connecting to opposite edges of said sheet.

9. The method of claim 7 wherein said further removing step is performed between at least one of said score lines and intersecting with an edge of said sheet, thereby destroying said frame integrity.

10. The method of claim 7 comprising the further steps of:

depositing solder on selected regions of said conductive pattern;

populating said printed circuit board with electrical circuit elements;

reflowing said solder, thereby electrically connecting said conductive pattern to said electrical circuit elements.

11. The method of claim 8 comprising the further steps of:

depositing solder on selected regions of said conductive pattern;

populating said printed circuit board with electrical circuit elements;

reflowing said solder, thereby electrically connecting said conductive pattern to said electrical circuit elements.

12. The method of claim 9 comprising the further steps of:

depositing solder on selected regions of said conductive pattern;

populating said printed circuit board with electrical circuit elements;

reflowing said solder, thereby electrically connecting said conductive pattern to said electrical circuit elements.

13. A method of forming and fabricating a printed circuit board comprising the steps of:

providing an insulative sheet of material;

forming on at least one surface of said insulative sheet a plurality of conductive patterns, forming circuit conductive paths;

scoring said sheet to form an outline of said printed circuit board with score lines, while preserving a frame of insulative sheet material at least partially surrounding said printed circuit board;

cutting a partial outline of said printed circuit board thereby defining a portion of said printed circuit board boundaries;

said scoring step leaving a region of insulative sheet material unscored proximate corners of said printed circuit board, said scoring step further interconnecting at least one of said score lines with said partial outline;

a further cutting step of removing said unscored region of insulative material and interconnecting to an edge of said sheet, and breaking said panel at said score line, thereby separating segments of said frame from said printed circuit board.

14. The method of claim 13 comprising the further steps of:

depositing solder on selected regions of said conductive pattern;

populating said printed circuit board with electrical circuit elements;

reflowing said solder, thereby electrically connecting said conductive pattern to said electrical circuit elements.

15. The method of claim 13 wherein said step of further cutting extends between an end of said score line and intersecting with edges of said sheet and is performed at and connecting to opposite edges of said sheet.

16. The method of claim 13 wherein said cutting step is performed between at least one of said score lines and intersecting with an edge of said sheet, thereby destroying said frame integrity.

17. The method of claim 13 wherein said scoring step forms discontinuous score lines leaving segments of unscored insulative material connecting said printed circuit board and said frame.

18. The method of claim 17 wherein said cutting step forms a discontinuous cut leaving segments of uncut insulative material bridging between said printed circuit board and said frame.

19. The method of claim 13 wherein said cutting step forms a discontinuous cut leaving segments of uncut insulative material bridging between said printed circuit board and said frame.

* * * * *